(12) United States Patent
Kubota

(10) Patent No.: US 6,285,592 B1
(45) Date of Patent: Sep. 4, 2001

(54) DATA STORAGE DEVICE HAVING SUPERIOR DATA RETENTION CHARACTERISTIC AND METHOD

(75) Inventor: Taisha Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/580,957

(22) Filed: May 30, 2000

(30) Foreign Application Priority Data

May 28, 1999 (JP) .................................................. 11-149785

(51) Int. Cl.[7] .............................. G11C 16/04; G11C 16/06
(52) U.S. Cl. ................................ 365/185.22; 365/185.18; 365/185.23
(58) Field of Search ....................... 365/185.22, 185.23, 365/185.18, 185.17

(56) References Cited

U.S. PATENT DOCUMENTS

| 4,253,059 | * | 2/1981 | Bell et al. ............................. 714/721 |
| 5,097,446 | * | 3/1992 | Shoji et al. ...................... 365/185.12 |
| 5,886,905 | * | 3/1999 | Yokozawa ............................... 703/14 |
| 5,920,508 | * | 9/1999 | Miyakawa et al. .............. 365/185.22 |

FOREIGN PATENT DOCUMENTS 9-306182   11/1997   (JP) .

* cited by examiner

*Primary Examiner*—Son Mai
(74) *Attorney, Agent, or Firm*—Young & Thompson (57) ABSTRACT

A data storage device such as a flash memory device and the like, and a method and device for storing data in a data memory means. The data storage device comprises: a plurality of data memory means such as floating gate MOS transistors; data charge injecting means which selectively injects electric charges into said floating gate of each of the data memory means to write data to the data memory means. The data storage device also comprises a trap dissolving means which injects additional electric charges into the floating gates of at least a part of the plurality of data memory means to compensate for deterioration of a threshold voltage of each of the data memory means caused by the movement of electric charges from the floating gate to trap sites in the tunnel oxide film a predetermined time, after the data charge injecting means injects electric charges into the floating gates to write the data to the data memory means.

20 Claims, 7 Drawing Sheets

PRIOR ART

FIG. 8

PRIOR ART

FIG. 9

DATA STORAGE DEVICE HAVING SUPERIOR DATA RETENTION CHARACTERISTIC AND METHOD

FIELD OF THE INVENTION

The present invention relates generally to storing data in a storage cell or a data memory means by selectively storing electric charges therein. More particularly, the present invention relates to a method and apparatus for storing data into a storage cell having a floating gate, a data storage device and the like, in which loss of electric charges stored in the storage cell can be easily and reliably compensated and superior data retention characteristic can be realized.

BACKGROUND OF THE INVENTION

At present, various types of memory devices are used as data storage devices in various electronic equipments. Among such memory devices, there are memory devices, such as a flash memory device, an EPROM (Erasable Programmable ReadOnly Memory) device, an EEPROM (Electrically Erasable Programmable Read-Only Memory) device, and the like into which binary data is stored or set by storing electric charges into a storage cell or cells and from which the binary data is freely retrievable.

Each of these memory devices generally comprises a number of memory cells as a plurality of data storage cells. The memory cells are disposed in a two dimensional array or in a matrix. Each of these memory cells is constituted of a field effect transistor circuit comprising a floating gate (FG) and a tunnel oxide film, and stores electric charges injected into the floating gate to store data.

In such memory devices, a plurality of word lines and a plurality of bit lines are disposed in vertical and lateral directions, and coupled with the memory cells disposed in the two dimensional array. Also, as a charge injection means, driver circuits and control circuits are coupled to these word lines and bit lines.

In the data storage device having the above-mentioned structure, it is possible to freely store digital data and to freely read out or retrieve the stored digital data. In this case, a series of binary data bits constituting the digital data are allocated to a series of memory cells, and electric charges are injected into each of the memory cells according to the digital data. Each of the memory cells stores electric charges selectively injected thereinto and therefore a series of binary data bits are written into the data storage device, which binary data bits can be freely read out from the data storage device.

In some of the above-mentioned data storage devices, a data verify operation is performed to compensate for incomplete injection of electric charges. In the data storage device performing the data verify operation, a threshold voltage of each memory cell is measured immediately after injecting electric charges into each memory cell, and it is judged if the electric charges are not appropriately injected into each memory cell. Then, electric charges are injected again into a memory cell or cells into which it is determined that electric charges are not stored properly. Thereby, incomplete or defective injection of electric charges is compensated, and it is possible to reliably write digital data into a data storage device.

However, even if electric charges are injected into a floating gate of a memory cell and thereby stored in the memory cell, the electric charges are sometimes decreased due to thermal emission or current leakage as time elapses. If the electric charges stored in a memory cell are decreased, it becomes difficult to correctly read out digital data written into and stored in the memory cell.

In order to solve such problem, a data storage device is disclosed in Japanese patent laid-open publication No. 9-306182. In the data storage device disclosed in this publication, multi-valued data is written into and stored in each of non-volatile memory cells. Quantity of electric charges in each memory cell is measured regularly, and if a result of the measurement indicates that the quantity of electric charges is out of an allowable range, data write or data setting operation is again performed.

Figure 7:
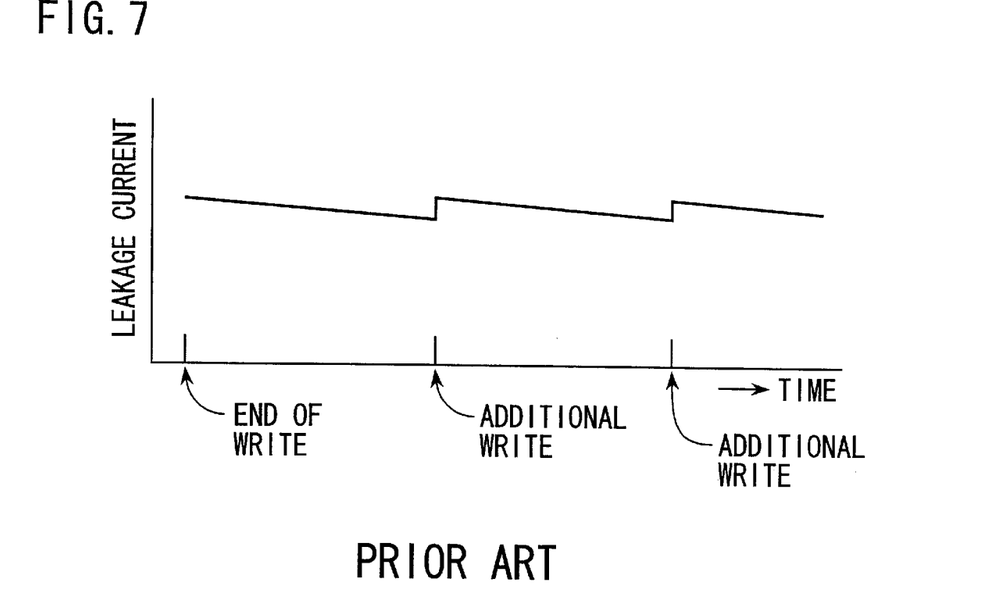
FIG. 7 is a graph showing a change of a current flowing from a floating gate to a tunnel oxide film of a memory cell with respect to time, which is assumed in a conventional memory device.
Figure 8:
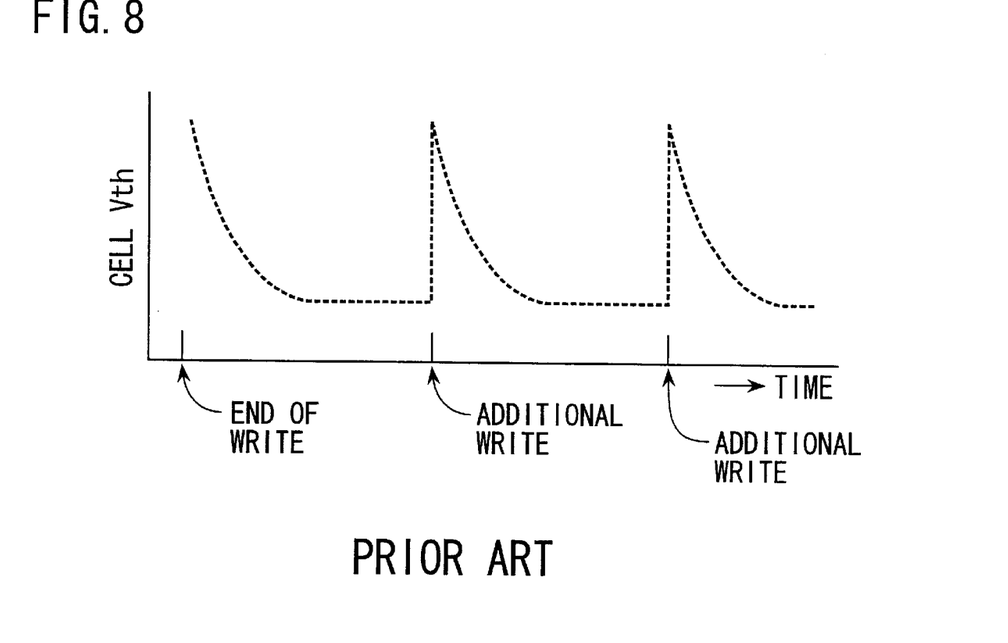
FIG. 8 is a graph showing a change of a threshold voltage of a memory cell which corresponds to electric charges stored in the memory cell with respect to time, which is assumed in a conventional memory device.

In the data storage device disclosed in the above-mentioned Japanese publication, since the cause of secular loss of electric charges is considered to be thermal emission and current leakage, and, as shown in FIG. 7, rate of leakage of a current is assumed to be approximately constant. Therefore, even when charge storage ability of a memory cell is deteriorated by the repeated application of stress and the like, it is expected that necessary electric charges can be maintained by regularly repeating data setting or writing to the memory cell, as shown in FIG. 8.

However, in a recent data storage device, precision in manufacturing and various property of materials are improved, and decrease of electric charges due to thermal emission and current leakage is almost resolved. Therefore, it is hardly necessary to measure a threshold voltage of a memory cell regularly and to inject electric charges again as mentioned in the above-mentioned Japanese publication. Also, occurrence of inferior charge injection is very rare at present, and the above-mentioned verify operation is also omitted in general products.

For example, in a recent data storage device such as a flash memory device, an EPROM device, an EEPROM device and the like, loss of electric charges due to thermal emission and current leakage is almost resolved. Therefore, it is not necessary to measure a threshold voltage of a memory cell regularly and to inject electric charges again frequently. Also, occurrence of inferior charge injection is almost resolved, and the above-mentioned verify operation can also omitted.

However, even in a recent data storage device, when data write and/or data erasure are repeatedly performed, there is a possibility that property or ability of storing electric charges in a memory cell is sometimes deteriorated. The main cause of such deterioration is considered to be as follows. When stress such as movement of electric charges and the like is repeatedly applied to a tunnel oxide film, trap sites are produced in the tunnel oxide film, and electric charges stored in a floating gate move to the trap sites, thereby electric charges stored in the floating gate is decreased.

It may be possible to resolve such reduction of electric charges in the floating gate caused by the trap sites of the tunnel oxide film, by a general verify operation or the rewrite operation disclosed in the above-mentioned Japanese publication. However, since the verify operation is performed immediately after injection of electric charges, there is a strong possibility that the verify operation is performed before the movement of electric charges from the floating gate to the trap sites in the tunnel oxide film. It is considered that electric charges move after the verify operation.

Also, in the data storage device described in the above-mentioned Japanese publication, it is assumed that a threshold voltage of each memory cell drops at a predetermined rate due to thermal emission and current leakage. Thus, the threshold voltage of each memory cell is regularly measured and injection of electric charges is repeatedly performed. Therefore, it is difficult to efficiently and effectively compensate for loss of stored electric charges caused by the trap sites.

Especially, in case the data storage device is integrated into an electronic equipment such as a computer system and the like, it is easily possible to regularly detect a threshold voltage of a memory cell and to repeat injection of electric charges. However, in case the data storage device is constituted as a memory card and the like, it is difficult to perform such operation because of power consumption and the like.

SUMMARY OF THE INVENTION

Therefore, it is an object of the present invention to provide a method and apparatus for storing data into a storage cell, a data storage device and the like, in which loss of electric charges stored in the storage cell can be easily compensated and reliable data retention characteristic can be realized.

It is another object of the present invention to provide a method and apparatus for storing data into a storage cell, a data storage device and the like, in which loss of electric charges in the storage cell caused by the trap sites in a tunnel oxide film can be easily compensated and reliable data retention characteristic can be realized.

It is still another object of the present invention to provide a method and apparatus for storing data into a storage cell, a data storage device and the like, in which loss of electric charges stored in the storage cell caused by the trap sites in a tunnel oxide film can be easily compensated without repeating injection of electric charges regularly.

It is still another object of the present invention to provide a method and apparatus for storing data into a storage cell, a data storage device and the like, in which loss of electric charges stored in the storage cell caused by the trap sites in a tunnel oxide film can be easily compensated without causing large power consumption.

It is still another object of the present invention to obviate the disadvantages of the conventional method and apparatus for storing data into a storage cell, a data storage device and the like.

According to an aspect of the present invention, there is provided a data storage device comprising: a plurality of data memory means each of which comprises at least a floating gate and a tunnel oxide; data charge injecting means which selectively injects electric charges into the floating gate of each of the data memory means to write data to the data memory means; and trap dissolving means which injects additional electric charges into the floating gates of at least a part of the plurality of data memory means to compensate for deterioration of a threshold voltage of each of the data memory means caused by the movement of electric charges from the floating gate to trap sites in the tunnel oxide film a predetermined time after the data charge injecting means injects electric charges into the floating gates to write the data to the data memory means.

In this case, it is preferable that the additional electric charges are injected to all of the plurality of data memory means uniformly.

It is also preferable that the data storage device further comprises injection verifying means which, immediately after the data charge injecting means selectively stores electric charges in the floating gate of each of the data memory means to write the data to the data memory means, determines in verify operation if electric charges are appropriately injected into each of the data memory means; and verify execution means which injects electric charges in verify operation into the data memory means in which electric charges are not appropriately injected; wherein the additional electric charges are injected into all of the plurality of data memory means uniformly after the verify execution means injects electric charges in the verify operation into the data memory means in which electric charges are not appropriately injected.

It is further preferable that the additional electric charges are injected into the floating gate to compensate for deterioration of a threshold voltage of the data memory means is performed a predetermined time after electric charges are injected in the verify operation into the data memory means in which electric charges are not appropriately injected.

It is advantageous that the data storage further comprises determining means which, after the data written to the data memory means has become retrievable, determines if threshold voltage each of the data memory means becomes equal to or lower than a predetermined reference voltage; and the additional electric charges are selectively injected to the data memory means whose threshold voltage is equal to or lower than the predetermined reference voltage.

It is also advantageous that the data storage device further comprises: injection verifying means which, immediately after the data charge injecting means selectively stores electric charges in the floating gate of each of the data memory means to write the data to the data memory means, determines in verify operation if electric charges are appropriately injected into each of the data memory means; and verify executing means which injects electric charges in verify operation into the data memory means in which electric charges are not appropriately injected; wherein the additional electric charges are selectively injected to the data memory means whose threshold voltage is equal to or lower than the predetermined reference voltage, after the verify executing means injects electric charges in the verify operation into the data memory means in which electric charges are not appropriately injected.

According to another aspect of the present invention, there is provided a method of storing data in a data memory means which comprises at least a floating gate and a tunnel oxide film by storing electric charges in the floating gate, the method comprising: injecting electric charges into the floating gate to write the data to the data memory means; and injecting additional electric charges into the floating gate to compensate for deterioration of a threshold voltage of the data memory means caused by the movement of electric charges from the floating gate to trap sites in the tunnel oxide film a predetermined time after electric charges are injected into the floating gate to write the data to the data memory means and after the data written to the data memory means becomes retrievable.

In this case, it is preferable that there are provided a plurality of the data memory means and data are stored in the plurality of data memory means by selectively storing electric charges in the floating gate of each of the data memory means, the additional electric charges are injected to all of the plurality of data memory means uniformly.

It is also preferable that the method further comprises: immediately after the selectively storing electric charges in the floating gate of each of the data memory means to write the data to the data memory means, determining in verify operation if electric charges are appropriately injected into each of the data memory means; and injecting electric charges in verify operation into the data memory means in which electric charges are not appropriately injected; wherein the additional electric charges are injected to all of the plurality of data memory means uniformly after injecting electric charges in the verify operation into the data memory means in which electric charges are not appropriately injected.

It is further preferable that the injecting additional electric charges into the floating gate to compensate for deterioration of a threshold voltage of the data memory means is performed a predetermined time after electric charges are injected in the verify operation into the data memory means in which electric charges are not appropriately injected.

It is advantageous that there are provided a plurality of the data memory means and data are stored in the plurality of data memory means by selectively storing electric charges in the floating gate of each of the data memory means; that, after the data written to the data memory means has become retrievable, it is determined if threshold voltage each of the data memory means becomes equal to or lower than a predetermined reference voltage; and wherein the additional electric charges are selectively injected to the data memory means whose threshold voltage is equal to or lower than the predetermined reference voltage.

It is also advantageous that the method further comprises: immediately after selectively storing electric charges in the floating gate of each of the data memory means to write the data to the data memory means, determining in verify operation if electric charges are appropriately injected into each of the data memory means; and injecting electric charges in verify operation into the data memory means in which electric charges are not appropriately injected; wherein the additional electric charges are selectively injected to the data memory means whose threshold voltage is equal to or lower than the predetermined reference voltage, after injecting electric charges in the verify operation into the data memory means in which electric charges are not appropriately injected.

According to still another aspect of the present invention, there is provided an information storage medium which stores a program for making a computer execute a method for storing data as mentioned in each of the items above.

According to still another aspect of the present invention, there is provided a device for storing data in a data memory means which comprises at least a floating gate and a tunnel oxide film by storing electric charges in the floating gate, the device comprising: data charge injecting means which injects electric charges into the floating gate to write the data to the data memory means; and trap dissolving means which injects additional electric charges into the floating gates to compensate for deterioration of a threshold voltage of the data memory means caused by the movement of electric charges from the floating gate to trap sites in the tunnel oxide film a predetermined time after the data charge injecting means injects electric charges into the floating gate to write the data to the data memory means and after the data written to the data memory means becomes retrievable.

In this case, it is preferable that there are provided a plurality of the data memory means and data are stored in the plurality of data memory means by selectively storing electric charges in the floating gate of each of the data memory means, the additional electric charges are injected to all of the plurality of data memory means uniformly.

It is also preferable that the device further comprises: injection verifying means which, immediately after the data charge injecting means selectively stores electric charges in the floating gate of each of the data memory means to write the data to the data memory means, determines in verify operation if electric charges are appropriately injected into each of the data memory means; and verify execution means which injects electric charges in verify operation into the data memory means in which electric charges are not appropriately injected; wherein the additional electric charges are injected to all of the plurality of data memory means uniformly after the verify execution means injects electric charges in the verify operation into the data memory means in which electric charges are not appropriately injected.

It is further preferable that the trap dissolving means injects additional electric charges into the floating gate to compensate for deterioration of a threshold voltage of the data memory means is performed after a predetermined time the verify executing means injects electric charges in verify operation into the data memory means in which electric charges are not appropriately injected.

It is advantageous that there are provided a plurality of the data memory means and data are stored in the plurality of data memory means by selectively storing electric charges in the floating gate of each of the data memory means; that the device further comprises determining means which, after the data written to the data memory means has become retrievable, determines if threshold voltage each of the data memory means becomes equal to or lower than a predetermined reference voltage; and that the additional electric charges are selectively injected to the data memory means whose threshold voltage is equal to or lower than the predetermined reference voltage.

It is also advantageous that the device further comprises: injection verifying means which, immediately after the data charge injecting means selectively stores electric charges in the floating gate of each of the data memory means to write the data to the data memory means, determines in verify operation if electric charges are appropriately injected into each of the data memory means; and verify executing means which injects electric charges in verify operation into the data memory means in which electric charges are not appropriately injected; wherein the additional electric charges are selectively injected to the data memory means whose threshold voltage is equal to or lower than the predetermined reference voltage, after the verify executing means injects electric charges in the verify operation into the data memory means in which electric charges are not appropriately injected.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF THE PREFERRED EMBODIMENT

Figure 9:
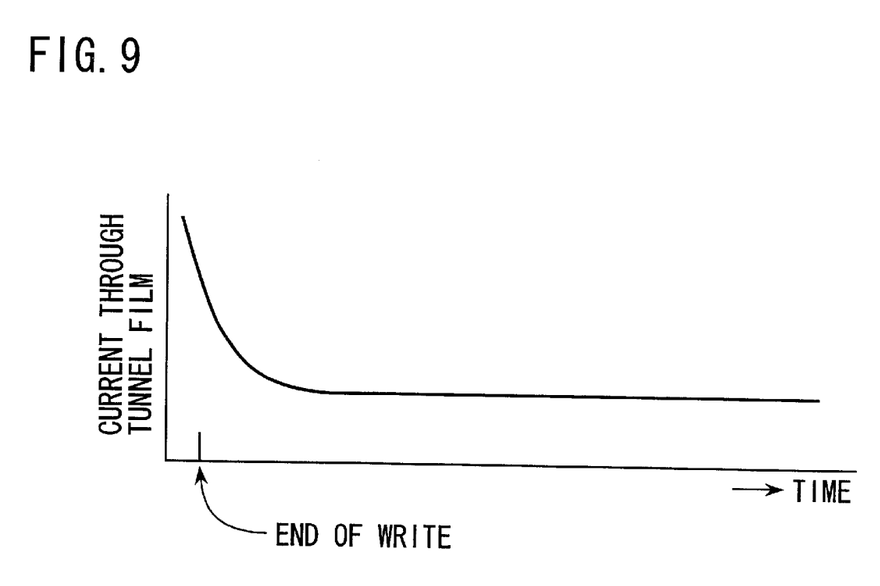
FIG. 9 is a graph showing a change of a current flowing from a floating gate to a tunnel oxide film of a memory cell with respect to time, which is obtained by a simulation by the inventor of the present invention.

First, the basic principle of the present invention will be described. The inventor simulated a behavior of a current flowing from a floating gate to a tunnel oxide film, in a memory cell comprising a floating gate MOS transistor. FIG. 9 shows a result of such simulation. As shown in FIG. 9, immediately after injection of electric charges into a floating gate, a plenty of current flows from the floating gate to the tunnel oxide film. However, the current decreases rapidly thereafter with time and reaches an approximately constant value in a predetermined time. This is because, when electrons are injected into the floating gate, trap sites are produced inevitably in the tunnel oxide film. Immediately after injection of electric charges into the floating gate, electric charges start to move from the floating gate to the trap sites of the tunnel oxide film, and when the trap sites are filled with electric charges, movement of electric charges are suppressed.

That is, when electric charges injected into the floating gate move to the trap sites of the tunnel oxide film, the trap sites are filled with the electric charges and current drain from the floating gate to the trap sites is suppressed, so that the threshold voltage of the memory cell becomes a steady state at a reduced voltage. When electric charges are again injected in such condition into the floating gate, the lack of electric charges in the floating gate is compensated while the trap sites of the tunnel oxide film are kept filled with electric charges. Thus, by injecting electric charges again only once at an appropriate timing after the usual injection of electric charges for data write, electric charges stored in the floating gate do not decrease again because the trap sites of the tunnel oxide film are filled with electric charges. Therefore, it is not necessary to repeatedly perform detection of the threshold voltages and injection of electric charges like the conventional data storage device.

The data storage device according to the present invention comprises a plurality of data memory means such as floating gate MOS transistors and the like, and a device for setting or storing data according to the present invention. In the data storage device according to the present invention, electric charges are injected into each of the plurality of memory means when setting or writing data corresponding to one of the statuses of binary data therein, so that the data memory means store electric charges injected thereinto. In such case, the data setting device according to the present invention also injects electric charges to the data memory means for compensating for decrease in the electric charges stored in the memory means. Therefore, the data storage device according to the present invention can surely and reliably store digital data comprising a series of binary data.

It should be noted that various means used in the present invention can be realized by any method and/or devices which can appropriately perform their necessary function. For example, such means can be realized by dedicated hardware, by a computer which can perform predetermined function by using a program, by using function realized in a computer by a program, any combination of these, and the like. For example, the data memory means, such as a storage cell, in the present invention may be any means which comprises a floating gate and a tunnel oxide film and which can store electric charges injected thereinto to hold binary data and the like. A typical example of the data memory means is a FET device having a floating gate and a tunnel oxide film.

The data storage device according to the present invention may be any device or apparatus which comprises a plurality of data memory means and the like, and a data setting device. For example, the data storage device according to the present invention may be a flash memory device, an EPROM, an EEPROM device or the like. The data setting device may be any device which can set or write data corresponding to one of the statuses of binary data into a plurality of data memory means by injecting electric charges thereto. For example, the data setting device may be a driver circuit and/or a control circuit in a memory chip as a data storage device, a memory test apparatus for testing a cell array of a memory chip as a data storage device, and the like.

The information storage medium according to the present invention may be any hardware device in which a program is previously stored as software for making a computer execute various processing. For example, the information storage medium may be a ROM (Read Only Memory) device, an HDD (Hard Disk Drive), a FD (Floppy Disc), and the like which are built in a computer or an apparatus including a computer, or which can be connected to a computer or an apparatus including a computer.

The computer in the present invention may be any apparatus which can read a program constituting software and which can execute a processing operation corresponding to the program. For example, the computer may be an apparatus which includes a CPU (Central Processing Apparatus) as a main portion and which comprises various devices such as a ROM, a RAM, an I/F and the like coupled with the CPU. The computer may be such an apparatus which controls operation of various devices and the like in accordance with the software.

Figure 1:
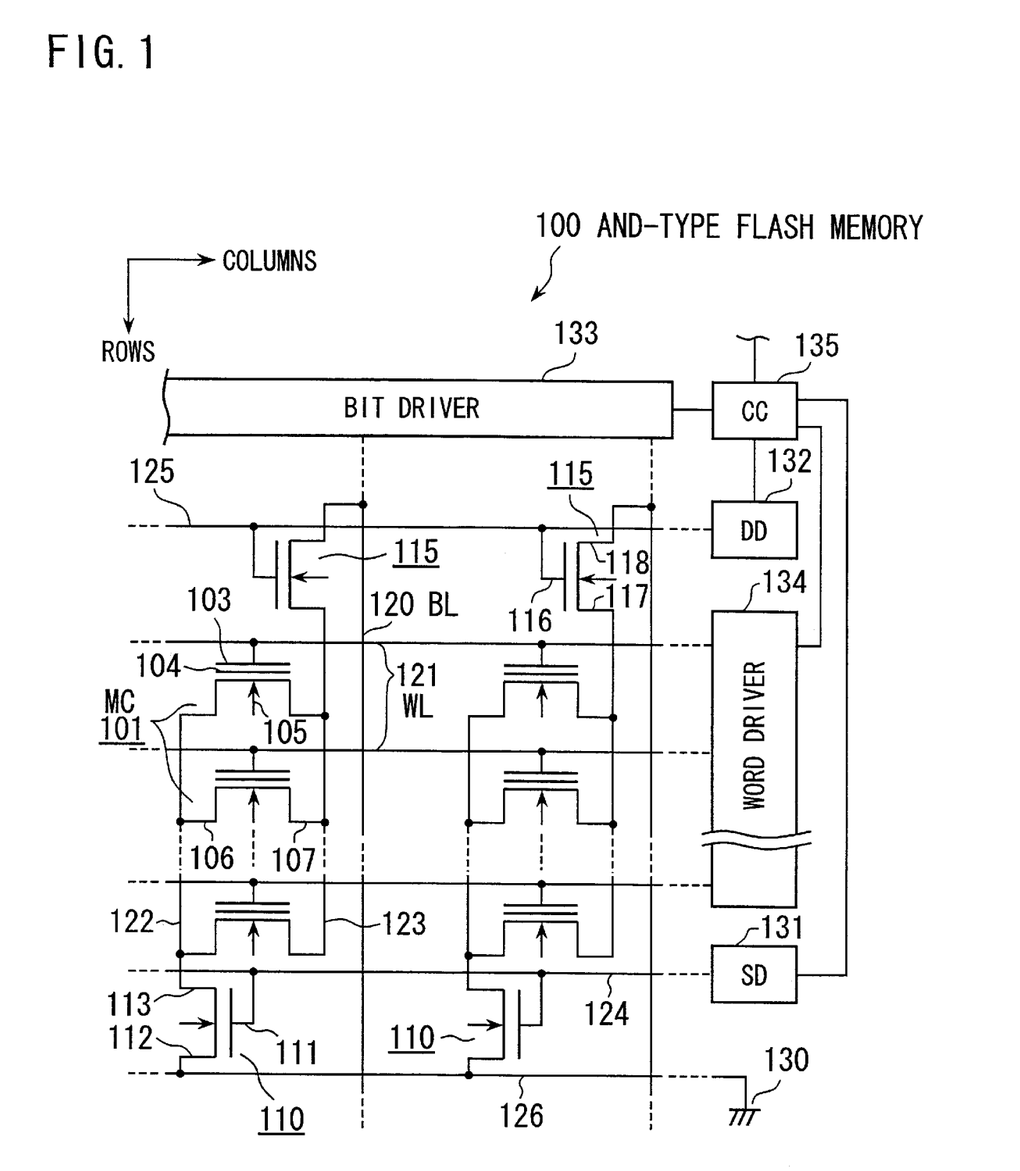
FIG. 1 is a schematic block circuit diagram showing a structure of a flash memory device as a data storage device according to the present invention.
Figure 2:
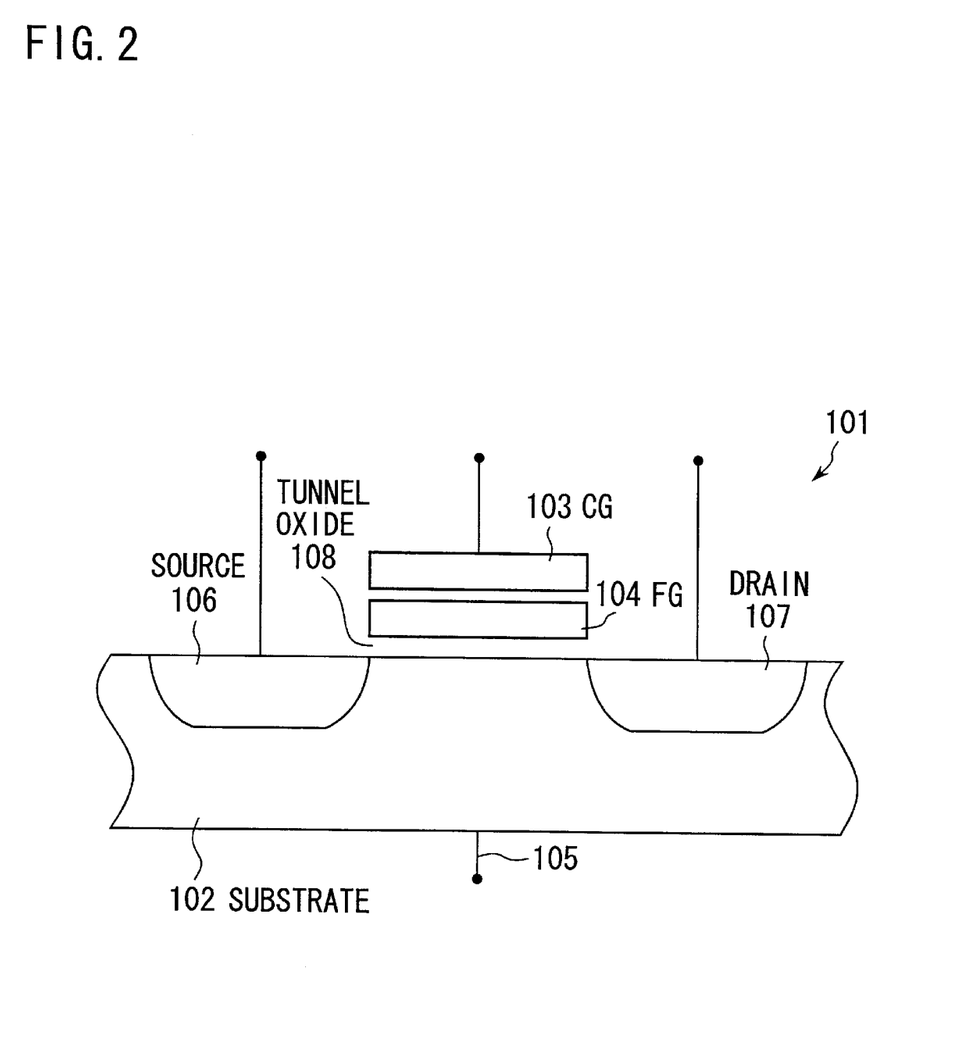
FIG. 2 is a schematic cross sectional view showing a structure of a memory cell used in the flash memory device of FIG. 1.
Figure 3:
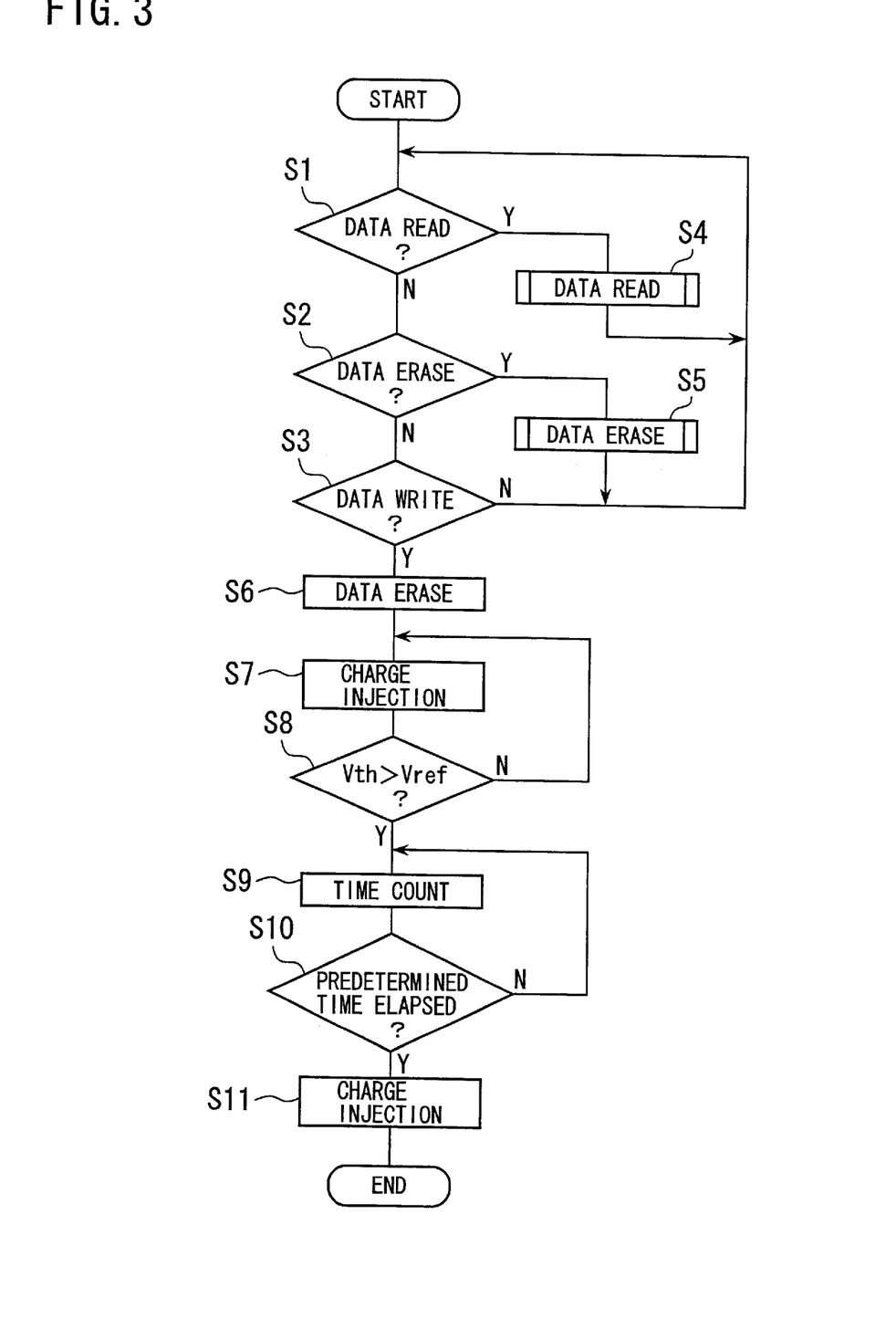
FIG. 3 is a flowchart illustrating a method for storing data in a flash memory device shown in FIG. 1, according to an embodiment of the present invention.
Figure 4:
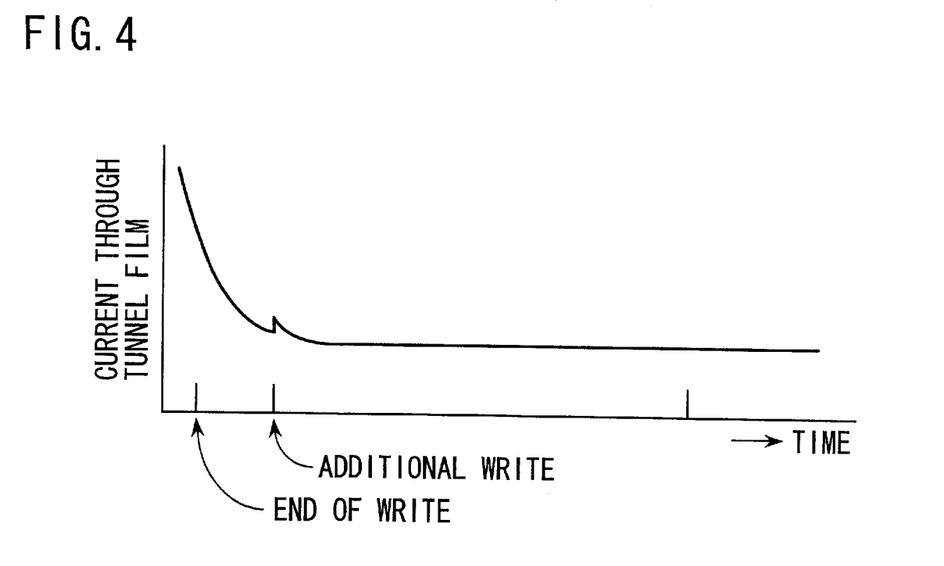
FIG. 4 is a graph showing a change of a current flowing from a floating gate to a tunnel oxide film of a memory cell with respect to time.
Figure 5:
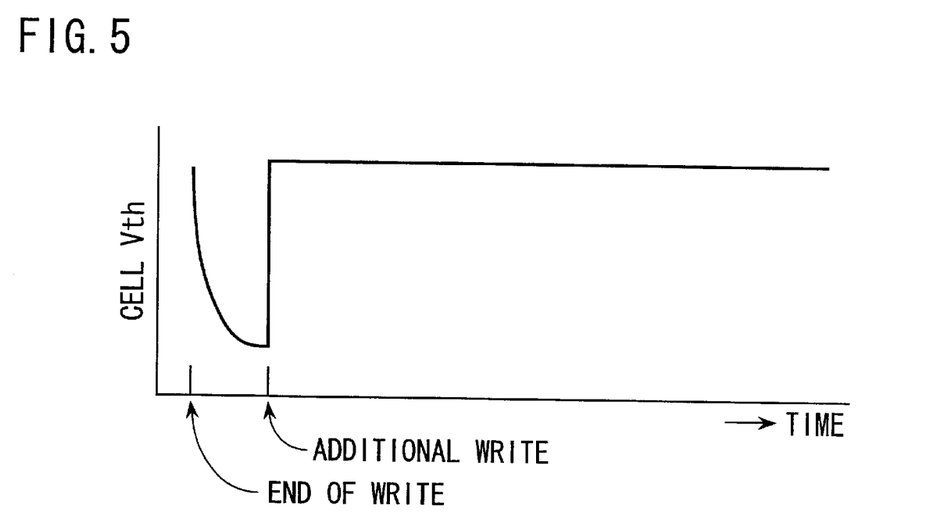
FIG. 5 is a graph showing a change of a threshold voltage of a memory cell which corresponds to electric charges stored in the memory cell with respect to time.

Now, with reference to the drawings, embodiments of the present invention will be described in detail. FIG. 1 through FIG. 5 relate to a first embodiment of the present invention. FIG. 1 is a schematic block circuit diagram showing an electrical structure of a flash memory device as an example of a data storage device according to the present invention. FIG. 2 is a schematic cross sectional view showing a structure of a memory cell used in the flash memory device of FIG. 1. FIG. 3 illustrates a method for storing data in a flash memory device of FIG. 1 according to an embodiment of the present invention. FIG. 4 shows a change of a current flowing from a floating gate to a tunnel oxide film of a memory cell with respect to time. FIG. 5 shows a change of a threshold voltage of a memory cell which corresponds to electric charges stored in the memory cell with respect to time.

The flash memory device of FIG. 1 is an AND type flash memory device which is designated by a reference numeral 100. The flash memory device of FIG. 1 comprises a large number of memory cells 101 as a plurality of data memory means. Here, the memory cells 101 are disposed in a matrix or a two dimensional array having m rows and n columns.

As shown in FIG. 2, each of these memory cells 101 is composed of an n-type floating gate MOS (Metal Oxide Semiconductor) transistor. Such MOS transistor, i.e., the memory cell 101, comprises a p-type silicon substrate 102, a source electrode 106 formed in the substrate 102 and a drain electrode formed in the substrate 102, and a back gate (BG). On the channel region formed in the substrate and between the source electrode 106 and the drain electrode 107, there are formed a tunnel oxide 108 not shown in the drawing, a floating gate (FG) 104, a control gate (CG) 103, a back gate (BG) 105, a source electrode 106, a drain electrode 107, and a tunnel oxide film 108. Actually, the back gate (BG) 105 is not formed as a dedicated layer or film, but is composed a portion of the substrate 102 which opposes the floating gate (FG) 104 via the tunnel oxide film 108.

Returning back again to FIG. 1, the flash memory device 100 also comprises n source selectors 110 each of which is composed of an n-type MOS transistor comprising a gate electrode 111, a source electrode 112 and a drain electrode 113.

Further, the flash memory device 100 also comprises n drain selectors 115 each of which is composed of an n-type MOS transistor comprising a gate electrode 116, a source electrode 117 and a drain electrode 118.

There are n bit lines 120 for n columns, and m word lines 121 for m rows. Drain electrodes 118 of the n drain selectors 115 are respectively coupled to n bit lines 120. Each of the m word lines 121 is coupled with the control gates (CG) 103 of the n memory cells 101 in one row. The control gates (CG) 103 of total (m×n) memory cells 101 are coupled with m word lines 121. Also, there are provided n source lines 122 for n columns. Each of the source lines 122 is coupled with the source electrodes 106 of m memory cells in one column. The n source lines 122 are also respectively coupled with the drain electrodes 113 of n source selectors 110.

Further, there are provided n drain lines 123 for n columns. Each of the drain lines 123 is coupled with the drain electrodes 107 of m memory cells in one column. The n drain lines 123 are also respectively coupled with the source electrodes 117 of n drain selectors 115. The gate electrodes 111 of the n source selectors 110 are commonly coupled with a source select line 124 of one row. The gate electrodes 116 of the n drain selectors 115 are commonly coupled with a drain select line 125 of one row.

The source electrodes 112 of the n source selectors 110 are commonly coupled to a ground line 126 of one row which is a reference potential line. The ground line 126 and the back gates (BG's) 105 of the memory cells 101 are coupled with the earth or ground electrode 130.

The source select line 124 is coupled with an output of a source driver (SD) 131, and the drain select line 125 is coupled with an output of a drain driver (DD) 132. The n bit lines 120 are coupled with a bit driver 133 which includes n bit driver units not shown in the drawing. The m word lines 121 are coupled with a word driver 134 which includes m word driver units not shown in the drawing.

The above-mentioned various drivers 131 through 134 function as a charge injection means, and injects electric charges into the memory cells 101 as one of statuses of binary data. These various drivers 131 through 134 are coupled with a control circuit (CC) 135 which is constituted, for example, of a microcomputer. These drivers 131 through 134 together with the control circuit 135 thereby function as a data setting apparatus according to the present invention.

The control circuit comprises, for example, a CPU which is the main part of a computer, a mask ROM which is an information storing medium, a RAM as a working memory and the like, as a hardware portion, not shown in the drawing. Also, a control program is stored, for example, in the mask ROM to constitute a firmware.

The CPU retrieves this control program and executes a processing operation instructed by such control program. Thereby, in the flash memory device according to the embodiment of the present invention, the control circuit 135 can function as a injection verifying means, a verify execution means, a time counting means, a trap eliminating or dissolving means, and the like.

That is, when electric charges are injected into the memory cells 101 by the drivers 131 through 134, the control circuit 135 determines whether the electric charges are appropriately injected into each memory cell just after injection of the electric charges. If it is determined that electric charges are not appropriately injected into one or more memory cells 101, that is, if there is inferior injection of electric charges in any of the memory cells 101, electric charges are again injected into such one or more memory cells to compensate for inferior injection of electric charges. This is a so-called verify operation conventionally done in a flash memory device and the like. In the present invention, it is possible to execute such verify operation similarly to the conventional memory device.

Further, in the flash memory device 100 according to the present embodiment, the control circuit 135 performs charge injection uniformly into all the memory cells 101 to compensate for reduction of stored electric charges. That is, after injection of electric charges in the verify operation is completed, a timer which is, for example, built in the control circuit 135 or which is realized by software in the control circuit 135 counts a predetermined time after which it becomes possible to freely read binary data from the memory cells 101. After the predetermined time elapses, the control circuit 135 controls operation of the various drivers 131 through 134 to uniformly inject electric charges into all the memory cells 101 to compensate for reduction of stored electric charges.

With reference to FIG. 3, operation of the flash memory device 100 according to the present embodiment will be described. The flash memory device 100 is always waiting for an instruction to perform data read operation, data erase operation or data write operation during steps SI through S3. The instruction to perform any of these operations is provided, for example, by a signal or signals supplied to the control circuit 135 from external in a manner well known in the art. For example, if, in step S1, it is determined that data read operation is to be performed, the data read operation is performed in a subroutine S4 as is well known in the art. If, in step S2, it is determined that data erase operation is to be performed, the data erase operation is performed in a subroutine S5 as is also well known in the art.

If, in step S3, it is determined that data write operation of digital data is to be performed, steps S6 through S11 are performed. That is, in step S6, by the various drivers 131 through 134, electric charges stored in particular memory cell or cells 101 corresponding to address data are initialized, that is, erased, and, in step S7, electric charges are selectively injected into the memory cell or cells, corresponding, for example, to a series of binary data constituting digital data.

More particularly, assuming that the flash memory 100 performs data write operation to, for example, one memory cell 101 located in the top row and in the left column in FIG. 1, the source driver 131 applies a ON drive signal to the source select line 124 to turn on the source selectors 110. Also, the drain driver 132 applies a ON drive signal to the drain select line 125 to turn on the drain selectors 110.

At the same time, the bit driver 133 applies a bit drive signal having a predetermined negative potential to the memory cell 101 to be written via one bit line 120 at the left column in FIG. 1. Also, the word driver 134 applies a word drive signal having a predetermined positive potential to the memory cell 101 to be written via one word line 121 in the top row in FIG. 1.

Thereby, in the memory cell 101 into which data is to be written, a positive potential is applied to the control gate (CG) 103 and a negative potential is applied to the drain electrode 107 while the reference potential is applied to the backgate (BG) 105 and the source electrode 106. Therefore, electrons are injected from the floating gate (FG) 104 to the drain electrode 107 via the tunnel oxide film 108, and thereby data corresponding to one of the statuses of binary data is written or set into the target memory cell 101.

When the above-mentioned normal data write operation is finished, in the flash memory device according to this embodiment, a verify operation is performed just after the normal write operation as shown in steps S8 and S7 in FIG. 3. That is, the control circuit 135 determines if the electric charges are appropriately injected into the memory cell into which data is to be written in step S8. This is done by determining if the threshold voltage Vth of the target memory cell 101 is larger than the predetermined reference threshold potential Vref. If it is determined, in step S8, that the electric charges are not appropriately injected, electric charges are again injected for compensation into the memory cell 101 by using various drivers 131 through 134, in step S9.

In the flash memory device according to the present invention, after finishing the above-mentioned verify operation, an operation for compensating for decrease in the stored electric charges in the memory cells 101 is performed, as shown in steps S9 through S11 in FIG. 3. That is, after finishing the verify operation, the timer in the control circuit 135 counts a predetermined time after which it becomes possible to freely read out binary data from the flash memory device 100, and it is determined if the predetermined time has elapsed (steps S9 and S10). After it is determined that the predetermined time as elapsed (S10), the control circuit 135 controls operation of the various driver circuits 131 through 134 such that electric charges are uniformly injected into all the memory cells 101 for compensating decrease in the electric charges stored in the memory cells 101 (step S11). Thereby, operation of data write or data setting is completed, and the flash memory device 100 according to this embodiment returns to an initial condition in which steps S1 through S3 are executed.

In the flash memory device according to this embodiment, when electric charges are injected into and stored in the memory cell 101 to write data corresponding to one of the statuses of binary data in the memory cell 101, a verify operation is performed immediately after the injection of the electric charges to compensate for inferior injection of electric charges. Further, after a predetermined time has elapsed from execution of the verify operation, electric charges are uniformly injected into all the memory cells for compensating for decrease in the electric charges stored in the memory cells.

As mentioned before, when electric charges are injected into the floating gate 104 of a memory cell 101 in the normal write operation or in the verify operation, trap sites are produced in the tunnel oxide film 108. Thereby, as shown in FIG. 4, immediately after the write operation including the verify operation, electric charges move from the floating gate 104 to the trap sites of the tunnel oxide film 108. Therefore, as shown in FIG. 5, the threshold voltage Vth of the memory cell 101 decreases with time.

However, in the flash memory device 100 according to this embodiment, as shown in FIG. 4, when electric charges stored in the floating gate 104 move to the trap sites in the tunnel oxide film 108 and fill the trap sites, additional electric charges are injected into the floating gate 104 in the additional write operation for compensating reduction of charges in the floating gate 104. Therefore, as shown in FIG. 5, it is possible to compensate for lack of electric charges in the floating gate 104 and the threshold voltage Vth of the memory cell 101 is recovered and kept in an appropriate value, while keeping the trap sites of the tunnel oxide film 108 filled with electric charges.

Therefore, in the flash memory device 100 according to the present invention, it is possible to prevent electric charges stored in the memory cells 101 from decreasing with time and to prevent digital data written into the memory cells 101 from disappearing or changing to different status. Even then, injection of electric charges for compensating for decrease in the electric charges stored in the memory cells is performed only once after each write operation. Thus, the memory cells are not fatigued uselessly and consumption of electric power can be decreased.

Especially, in this embodiment, additional write operation is performed to compensate for the drop of the threshold voltage Vth such that additional electric charges are injected into the floating gate 104, for example, during an interval in which electric charges are moving from the floating gate 104 to the trap sites of the tunnel oxide film 108. Therefore, it is not possible that trap sites are again produced in the tunnel oxide film 108 by this additional write operation. As a result, it is possible to surely realize a condition in which the trap sites of the tunnel oxide film 108 are filled with electric charges and sufficient electric charges are stored in the floating gate 104.

It should be noted that the present invention is not limited to the above-mentioned embodiment, but can be modified in various ways. For example, in the above-mentioned embodiment, the verify operation is performed immediately after the normal data write operation and, thereafter, the additional injection of electric charges for compensating for the drop of the threshold voltage Vth is performed. However, it is possible to omit the verify operation.

Also, in the above-mentioned embodiment, additional injection of electric charges into the floating gate 104 is performed to compensate for the drop of the threshold voltage Vth during an interval in which electric charges are moving from the floating gate 104 to the trap sites of the tunnel oxide film 108. However, it is also possible to perform additional injection of electric charges into the floating gate 104 after electric charges have substantially moved from the floating gate 104 to the trap sites of the tunnel oxide film 108.

Further, in the above-mentioned embodiment, data corresponding to one of the statuses of binary data is written or set into each of the memory cells 101 by injecting electric charges into the memory cells 101. However, it is also possible to write or set multi-valued data including binary data into each memory cell 101 by injecting electric charges in several stages. Of course, the term "data" used in this specification may include any information, signal and the like.

Still further, in the above-mentioned embodiment, the additional electric charges for compensating for the decrease in the stored electric charges are uniformly injected into all the memory cells 101. However, as shown in steps T1 and T2 of FIG. 6, it is possible to check the threshold voltages Vth of all the memory cells 101 (step Ti), and to additionally inject electric charges only into the memory cells 101 whose threshold voltages Vth are not sufficiently high (step T2).

Figure 6:
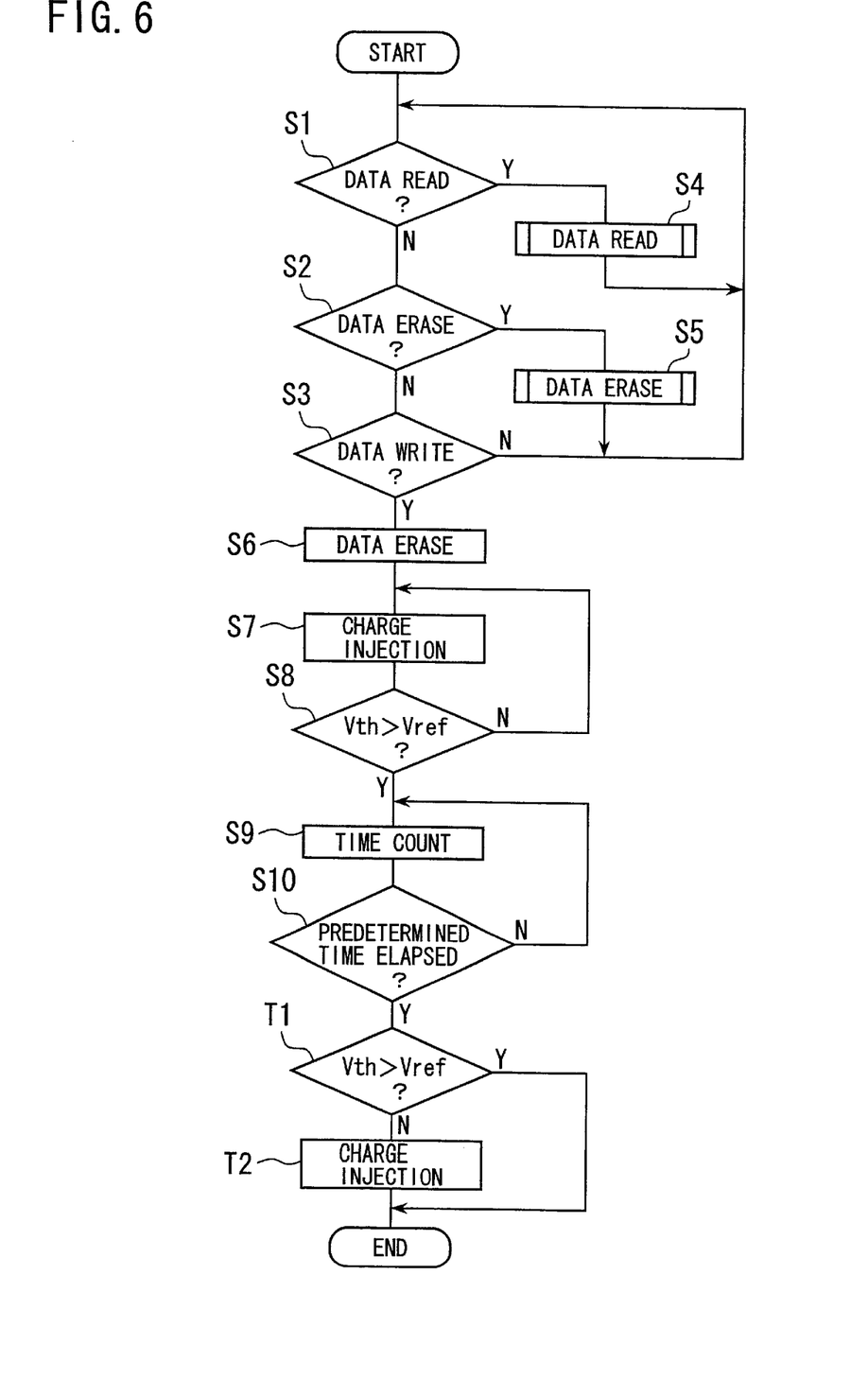
FIG. 6 is a flowchart illustrating a method for storing data in a flash memory device shown in FIG. 1 according to another embodiment of the present invention.

In such case, although additional steps are required to check the threshold voltage Vth, number of memory cells 101 into which additional injection of electric charges is to be performed. Therefore, when many of the memory cells 101 in the memory device have good characteristics, processing time for write operation can be reduced. Especially, in case the memory device also performs verify operation, the hard ware, the firmware and the like to perform such verify operation (steps S7 and S8) can also be used for performing such selective injection of electric charges for the additional write. Therefore, substantially, no additional hardware and the like is required for such selective write operation.

In the above-mentioned embodiment, the flash memory 100 in which a large number of memory cells 101 and the various circuits 131 through 135 are integrally formed is described as an example of a data storage device according to the present invention. However, it is possible to independently form the portion of the various circuits 131 through 135 as a data setting device (not shown in the drawing) separated from the portion of the memory cells 101.

Such data setting device can be implemented as, for example, a memory test apparatus which performs tests of a semiconductor memory device formed as a bare chip. In such case, various functions of the data setting apparatus can also be performed by hardware, software or combination thereof.

For example, the data setting apparatus can have a computer for performing the data setting operation and the like. Software for controlling operation of the data setting apparatus can be installed into the computer from an information storing medium such as a ROM card and the like. It is preferable that the information storing medium stores a program for controlling the computer such that, after finishing injection of electric charges to a memory cell 101 for setting or writing data corresponding to one of the statuses of binary data therein, a predetermined time is measured, such that after elapsing the predetermined time, additional electric charges are injected into the memory cell 101 for compensating for decrease in electric charges stored in the memory cell 101, and the like.

In the above, the present invention is described as embodiments on the flash memory device. However, the present invention is also applicable to devices, such as an EEPROM device and the like, other than the flash memory device mentioned above.

In summary, according to the present invention, the following advantageous effects can be obtained.

In the method and device for storing data of the present invention, after finishing injection of electric charges to a data memory means for setting or writing data corresponding to one of the statuses of binary data therein, a predetermined time after which the binary data can be read freely is measured by a timer and the like. After elapsing the predetermined time, additional electric charges are injected by a trap dissolving means into the data memory means for compensating for decrease in electric charges stored in the data memory means. Therefore, it is possible to prevent electric charges stored in the data memory means from decreasing with time and to prevent data written into the data memory means from disappearing or changing to different status. Even then, injection of electric charges for compensating for decrease in the electric charges stored in the data memory means is performed only once after each write operation. It is not necessary to repeatedly inject electric charges into the data memory means to avoid decrease in electric charges. Thus, the data memory means or the memory cells are not fatigued uselessly and consumption of electric power can be decreased.

The above-mentioned advantageous effects can also be obtained in the data storage device according to the present invention. Also, the above-mentioned advantageous effects are obtained when the information storage medium according to the present invention is used to make a computer execute the above-mentioned data setting or writing operation according to a program stored in such information storage medium.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A data storage device comprising:
    a plurality of data memory means each of which comprises at least a floating gate and a tunnel oxide;
    data charge injecting means which selectively inject s electric charges into said floating gate of each of said data memory means to write data to said data memory means; and
    trap dissolving means which injects additional electric charges into said floating gates of at least a part of said plurality of data memory means to compensate for deterioration of a threshold voltage of each of said data memory means caused by the movement of electric charges from said floating gate to trap sites in said tunnel oxide film a predetermined time after said data charge injecting means injects electric charges into said floating gates to write said data to said data memory means.

2. A data storage device as set forth in claim 1, wherein said additional electric charges are injected to all of said plurality of data memory means uniformly.

3. A data storage device as set forth in claim 1, further comprising:
    injection verifying means which, immediately after said data charge injecting means selectively stores electric charges in said floating gate of each of said data memory means to write said data to said data memory means, determines in verify operation if electric charges are appropriately injected into each of said data memory means; and verify execution means which injects electric charges in verify operation into said data memory means in which electric charges are not appropriately injected;

wherein said additional electric charges are injected into all of said plurality of data memory means uniformly after said verify execution means injects electric charges in said verify operation into said data memory means in which electric charges are not appropriately injected.

4. A data storage device as set forth in claim 3, wherein said additional electric charges are injected into said floating gate to compensate for deterioration of a threshold voltage of said data memory means is performed a predetermined time after electric charges are injected in said verify operation into said data memory means in which electric charges are not appropriately injected.

5. A data storage device as set forth in claim 1, wherein said data storage further comprises determining means which, after said data written to said data memory means has become retrievable, determines if threshold voltage each of said data memory means becomes equal to or lower than a predetermined reference voltage; and wherein said additional electric charges are selectively injected to said data memory means whose threshold voltage is equal to or lower than said predetermined reference voltage.

6. A data storage device as set forth in claim 5, further comprising:

injection verifying means which, immediately after said data charge injecting means selectively stores electric charges in said floating gate of each of said data memory means to write said data to said data memory means, determines in verify operation if electric charges are appropriately injected into each of said data memory means; and verify executing means which injects electric charges in verify operation into said data memory means in which electric charges are not appropriately injected;

wherein said additional electric charges are selectively injected to said data memory means whose threshold voltage is equal to or lower than said predetermined reference voltage, after said verify executing means injects electric charges in said verify operation into said data memory means in which electric charges are not appropriately injected.

7. A method of storing data in a data memory means which comprises at least a floating gate and a tunnel oxide film by storing electric charges in said floating gate, said method comprising:

injecting electric charges into said floating gate to write said data to said data memory means; and injecting additional electric charges into said floating gate to compensate for deterioration of a threshold voltage of said data memory means caused by the movement of electric charges from said floating gate to trap sites in said tunnel oxide film a predetermined time after electric charges are injected into said floating gate to write said data to said data memory means and after said data written to said data memory means becomes retrievable.

8. A method as set forth in claim 7, wherein there are provided a plurality of said data memory means and data are stored in said plurality of data memory means by selectively storing electric charges in said floating gate of each of said data memory means, said additional electric charges are injected to all of said plurality of data memory means uniformly.

9. A method as set forth in claim 8, further comprising:

immediately after said selectively storing electric charges in said floating gate of each of said data memory means to write said data to said data memory means, determining in verify operation if electric charges are appropriately injected into each of said data memory means; and injecting electric charges in verify operation into said data memory means in which electric charges are not appropriately injected;

wherein said additional electric charges are injected to all of said plurality of data memory means uniformly after injecting electric charges in said verify operation into said data memory means in which electric charges are not appropriately injected.

10. A method as set forth in claim 9, wherein said injecting additional electric charges into said floating gate to compensate for deterioration of a threshold voltage of said data memory means is performed a predetermined time after electric charges are injected in said verify operation into said data memory means in which electric charges are not appropriately injected.

11. A method as set forth in claim 7, wherein there are provided a plurality of said data memory means and data are stored in said plurality of data memory means by selectively storing electric charges in said floating gate of each of said data memory means;

wherein after said data written to said data memory means has become retrievable, it is determined if threshold voltage each of said data memory means becomes equal to or lower than a predetermined reference voltage; and wherein said additional electric charges are selectively injected to said data memory means whose threshold voltage is equal to or lower than said predetermined reference voltage.

12. A method as set forth in claim 11, further comprising:

immediately after selectively storing electric charges in said floating gate of each of said data memory means to write said data to said data memory means, determining in verify operation if electric charges are appropriately injected into each of said data memory means; and injecting electric charges in verify operation into said data memory means in which electric charges are not appropriately injected;

wherein said additional electric charges are selectively injected to said data memory means whose threshold voltage is equal to or lower than said predetermined reference voltage, after injecting electric charges in said verify operation into said data memory means in which electric charges are not appropriately injected.

13. An information storage medium which stores a program or making a computer execute a method as set forth in claim 7.

14. An information storage medium which stores a program for making a computer execute a method as set forth in claim 12.

15. A device for storing data in a data memory means which comprises at least a floating gate and a tunnel oxide film by storing electric charges in said floating gate, said device comprising:

data charge injecting means which injects electric charges into said floating gate to write said data to said data memory means; and trap dissolving means which injects additional electric charges into said floating gates to compensate for deterioration of a threshold voltage of said data memory means caused by the movement of electric charges from said floating gate to trap sites in said tunnel oxide film a predetermined time after said data charge injecting means injects electric charges into said floating gate to write said data to said data memory means and after said data written to said data memory means becomes retrievable.

16. A device as set forth in claim 15, wherein there are provided a plurality of said data memory means and data are stored in said plurality of data memory means by selectively storing electric charges in said floating gate of each of said data memory means, said additional electric charges are injected to all of said plurality of data memory means uniformly .

17. A device as set forth in claim 16, further comprising:
    injection verifying means which, immediately after said data charge injecting means selectively stores electric charges in said floating gate of each of said data memory means to write said data to said data memory means, determines in verify operation if electric charges are appropriately injected into each of said data memory means; and
    verify execution means which injects electric charges in verify operation into said data memory means in which electric charges are not appropriately injected;
    wherein said additional electric charges are injected to all of said plurality of data memory means uniformly after said verify execution means injects electric charges in said verify operation into said data memory means in which electric charges are not appropriately injected.

18. A device as set forth in claim 17, wherein said trap dissolving means injects additional electric charges into said floating gate to compensate for deterioration of a threshold voltage of said data memory means is performed after a predetermined time said verify executing means injects electric charges in verify operation into said data memory means in which electric charges are not appropriately injected.

19. A device as set forth in claim 15, wherein there are provided a plurality of said data memory means and data are stored in said plurality of data memory means by selectively storing electric charges in said floating gate of each of said data memory means;
    wherein said device further comprises determining means which, after said data written to said data memory means has become retrievable, determines if threshold voltage each of said data memory means becomes equal to or lower than a predetermined reference voltage; and
    wherein said additional electric charges are selectively injected to said data memory means whose threshold voltage is equal to or lower than said predetermined reference voltage.

20. A device as set forth in claim 19, further comprising:
    injection verifying means which, immediately after said data charge injecting means selectively stores electric charges in said floating gate of each of said data memory means to write said data to said data memory means, determines in verify operation if electric charges are appropriately injected into each of said data memory means; and
    verify executing means which injects electric charges in verify operation into said data memory means in which electric charges are not appropriately injected;
    wherein said additional electric charges are selectively injected to said data memory means whose threshold voltage is equal to or lower than said predetermined reference voltage, after said verify executing means injects electric charges in said verify operation into said data memory means in which electric charges are not appropriately injected.

* * * * *

UNITED STATES PATENT AND TRADEMARK OFFICE
CERTIFICATE OF CORRECTION

PATENT NO.      : 6,285,592 B1
DATED           : September 4, 2001
INVENTOR(S)     : Taishi Kubota It is certified that error appears in the above-identified patent and that said Letters Patent is hereby corrected as shown below:

<u>Title page,</u>
Correct the name of the inventor, from "Taisha" to -- Taishi --.

Signed and Sealed this

Twenty-sixth Day of February, 2002

*Attest:*

JAMES E. ROGAN
*Attesting Officer*        *Director of the United States Patent and Trademark Office*